US008711277B2

(12) United States Patent
Apel

(10) Patent No.: US 8,711,277 B2
(45) Date of Patent: Apr. 29, 2014

(54) METHOD FOR ASSEMBLING A CAMERA MODULE, AND CAMERA MODULE

(75) Inventor: Uwe Apel, Neckartailfingen (DE)

(73) Assignee: Robert Bosch GmbH, Stuttgart (DE)

( * ) Notice: Subject to any disclaimer, the term of this patent is extended or adjusted under 35 U.S.C. 154(b) by 896 days.

(21) Appl. No.: 12/224,454

(22) PCT Filed: Jan. 26, 2007

(86) PCT No.: PCT/EP2007/050755
§ 371 (c)(1),
(2), (4) Date: Dec. 15, 2008

(87) PCT Pub. No.: WO2007/107392
PCT Pub. Date: Sep. 27, 2007

(65) Prior Publication Data
US 2009/0128684 A1 May 21, 2009

(30) Foreign Application Priority Data

Mar. 22, 2006 (DE) .......................... 10 2006 013 164

(51) Int. Cl.
*H04N 5/225* (2006.01)
*G02B 7/02* (2006.01)

(52) U.S. Cl.
USPC ......................................... 348/360; 359/819

(58) Field of Classification Search
USPC .................... 348/340, 342, 360, 373–375;
257/431–435; 359/819–830
See application file for complete search history.

(56) References Cited

U.S. PATENT DOCUMENTS

| | | | |
|---|---|---|---|
| 7,019,571 B2* | 3/2006 | Lim ............................... | 327/157 |
| 7,391,457 B2* | 6/2008 | Fujimoto et al. .............. | 348/340 |
| 7,405,764 B2* | 7/2008 | Gustavsson et al. .......... | 348/374 |
| 7,474,351 B2* | 1/2009 | Minarik et al. ............... | 348/340 |
| 2002/0154239 A1 | 10/2002 | Fujimoto et al. | |
| 2003/0122957 A1* | 7/2003 | Emme .......................... | 348/370 |
| 2004/0094825 A1* | 5/2004 | Onishi et al. .................. | 257/666 |
| 2005/0048692 A1* | 3/2005 | Hanada et al. ................ | 438/106 |
| 2005/0168846 A1 | 8/2005 | Ye et al. | |
| 2005/0185088 A1 | 8/2005 | Kale | |
| 2005/0237415 A1 | 10/2005 | Kong et al. | |
| 2005/0285016 A1* | 12/2005 | Kong et al. ................ | 250/208.1 |

FOREIGN PATENT DOCUMENTS

| | | |
|---|---|---|
| DE | 10 2004 001 698 | 8/2005 |
| EP | 1 498 756 | 1/2005 |
| WO | WO 2005/031422 A1 | 4/2005 |

* cited by examiner

*Primary Examiner* — Trung Diep
(74) *Attorney, Agent, or Firm* — Kenyon & Kenyon LLP

(57) ABSTRACT

A method for manufacturing a camera module is provided, the camera module including a lens and an image sensor chip, the image sensor chip being electrically contacted to a circuit board. After a first fitting part that surrounds the image sensor chip is positioned and secured on the circuit board, the first fitting part is joined to a second fitting part disposed on the housing of the camera module, forming an overlap region. A focus position between the housing-side lens and the image sensor chip is produced, and a materially attached connection is then generated between the fitting parts within the overlap region, in the focus position.

12 Claims, 3 Drawing Sheets

METHOD FOR ASSEMBLING A CAMERA MODULE, AND CAMERA MODULE

BACKGROUND OF THE INVENTION

1. Field of the Invention

The present invention relates to a method for assembling a camera module for a vehicle.

2. Description of Related Art

Camera modules are being increasingly used these days in vehicles, for example for use in night vision systems or as lane departure warning (LDW) systems. Particular demands in terms of robustness are made on such cameras with regard to their installation in the vehicle, given the vibrations that unavoidably occur during operation.

Two fundamentally different approaches are known for the assembly of camera modules for vehicles: An imager module is used which encompasses an image sensor chip, a basic housing, and a lens, the lens being produced and tested as an independent module. Imaging modules of this kind can be attached to the circuit board, for example by thermal joining, e.g., using soldering methods, or by way of a cable end having a plug. The circuit board, completed in this fashion, is then installed into the housing, which must have a corresponding receptacle for the lens. A disadvantage of this procedure is the fact that imager modules having chip and lens dimensions suitable for motor vehicle applications cannot be reliably produced using common soldering methods (e.g., reflow methods). Because of the high heat capacity, poor solder connection points can form, or the optics can be damaged. On the other hand, the plug contacts known as alternative solutions are not fault-free over the long term in vehicles. A further problem that has emerged here is sealing of the entire camera module in the context of a circuit board plus imager module configuration, since mechanical stresses acting on the imager module often occur; this can result in subsequent damage.

A further assembly concept is based on configuration of the circuit board with an independently packaged image sensor; this typically involves a ceramic housing having a glass cover. The sensitive pixel array can thereby be sufficiently protected from particles. Such housings can moreover be processed using reflow processes. The lens can be focused either in a lens holder mounted on the circuit board, or in the housing shell of the camera module. This approach, however, exhibits a very long tolerance chain because of the larger number of individual components requiring installation; after assembly this can result, in the least favorable case, in inaccurately operating camera modules due to addition of the greatest tolerances.

Published German patent document DE 10 2004 001 698 discloses an optical module. According to this approach, an optical module encompasses an image acquisition device made up of optical and electronic components, the components of the image acquisition device being disposed together on a carrier plate. The components of the image acquisition device are disposed on a first principal surface of the carrier plate, an optical system associated with the image acquisition device being disposed on a second principal surface of the carrier plate. The carrier plate and the optical system are embedded in a sealing compound. The optical module encompasses a holding element for securing the optical module to a vehicle part or the like. The holding element is sealed to the optical module, and the optical module encompasses a shield against electromagnetic interference radiation. According to this approach, the shield can also be embedded in the sealing compound. The shield is preferably embodied as a net or lattice embedded in the sealing compound, or can be made up of particles embedded in the sealing compound.

A BRIEF SUMMARY OF THE INVENTION

It is an object of the invention to make available a camera module, suitable for motor vehicle applications, that contains as few sub-components as possible, in which module focus between an image sensor chip and the lens of the camera module is already obtained during assembly.

This object is achieved, according to the present invention, in that at least one sleeve-shaped fitting part is provided on either the circuit-board side or the housing side, which part is produced from a plastic that can be melted rapidly and in a limited region by local heating, and can thus be connected in firmly attached fashion to a further fitting part complementary to said fitting part.

In the method proposed according to the present invention for manufacturing a camera module, one may use a housing-side first fitting part and a circuit-board-side second fitting part that engage telescopically into one another upon assembly. The fitting parts, made of a plastic material, can be embodied both as sleeves and as cuboidal elements, or in any other geometry; it is simply necessary to ensure that, upon joining of the two fitting parts, an overlap region exists between the first fitting part and the second fitting part. At least one of the two fitting parts that are preferably used is coated with at least one electrically conductive winding through which a current pulse can be conveyed, leading to local melting of said fitting part, e.g., on its outer enveloping surface. Alternatively, fusion of an inner side of one of the two fitting parts that are preferably used can be generated.

Connectors to the conductive paths used for melting can be embodied either on a housing shell of the camera module or on the circuit board, in such a way that they can be contacted during the focusing process. Focusing is accomplished by active image readout and image evaluation, and by motorized alignment of the components to be joined to one another, usually a housing part and a preassembled or pre-populated circuit board. After focusing is carried out, a current pulse is delivered through the conductive paths that are applied in the form of a coating on one of the two fitting parts; said pulse brings about, by way of the melting of the plastic material, an adhesive bond and thus a materially attached connection, thereby generating a stable connection of the two fitting parts to one another.

The surfaces of the fitting parts that engage into one another can be textured in such a way that a stable connection is achievable with a current pulse having a minimum application time and power level.

A camera module produced in this fashion, in particular for use in applications in the automotive sector, has advantages that include the fact that because an, in particular, video-assisted die bonding process is used, the image sensor chip can be positioned directly with high precision with respect to reference holes that are configured in the circuit board. Placement errors that occur with separately accommodated image sensor chips are thus avoided. The one of the two fitting parts that is preferably associated with the circuit board can be secured in precisely fitting fashion within a placement area, in a number of reference orifices that are provided on the circuit board with, for example, a 120-degree pitch.

When a circuit board production process is used in which, for example, SMD components can be soldered onto the circuit board, the image sensor chip can be covered, directly after wire bonding, with the fitting part that is closed off with a membrane, and thus protected from particles that unavoidably occur in the manufacturing process. Because the highly sensitive image sensor chip is thus protected from particle contamination or particle deposition, all the further process, testing, and transport steps, up to installation into the housing of the camera module, can take place in any production environment. If, for example, the membrane is adhesively bonded onto the externally located fitting part having the larger diameter, the membrane or a film can be prevented from remaining thereon inadvertently prior to focusing.

The two fitting parts that are used are designed so that the supporting function of the circuit board can also be assumed. If the circuit board is attached to the housing-side contact plug using a flexible solution such as, for example, a flex cable or floating plug connectors, stress loads in the circuit board due to multiple clamping can be avoided.

The fitting parts, which can be, e.g., sleeve-shaped, can be fabricated from a material suitable for the optical requirements, so that very low reflection values are present and the risk of optical interference due to scattered light is considerably reduced.

A further advantage to be cited is that the lens can be integrated sealedly into the housing shell of the camera module, so that a subsequent sealing process step can be omitted.

The focus position, accurately set in the context of focusing, can be immobilized very quickly by way of the electrically controllable local melting process. In contrast to laser welding or UV curing, no problems occur, since the energy required for activation of the adhesive or fused bond is relatively low as compared with laser welding and UV curing.

A reduction in components can furthermore be achieved by the fact that the differentiation of cameras having a different design, i.e., a differently configured lens, but the same electronic configuration can be simplified, since only the housing part receiving the lens needs to be modified, whereas the preassembled or pre-populated circuit board can be an identical part.

A BRIEF DESCRIPTION OF THE SEVERAL VIEWS OF THE DRAWING

DETAILED DESCRIPTION OF THE INVENTION

Figure 1:
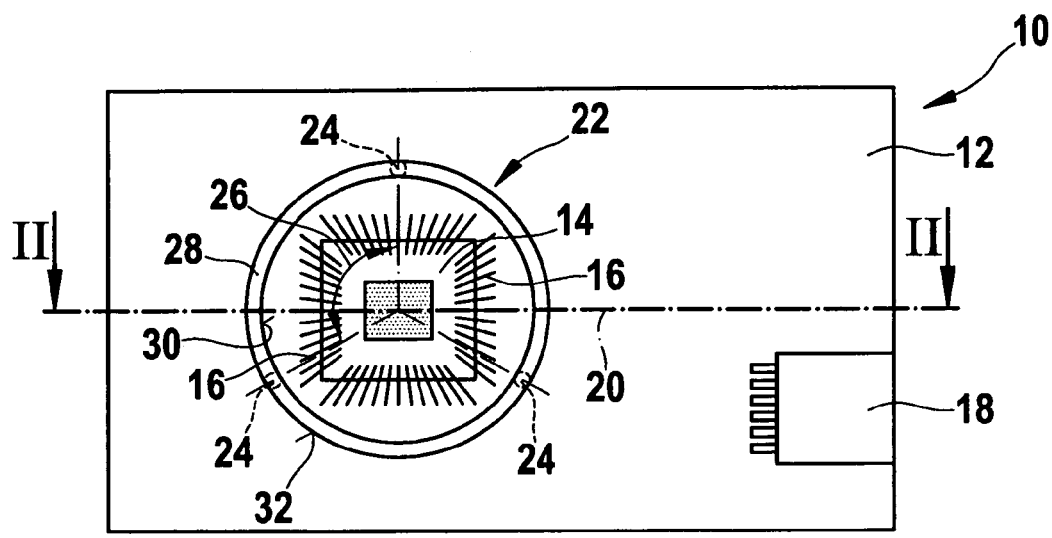
FIG. 1 is a plan view of the preassembled or pre-populated circuit board of a camera module according to the present invention.

A plan view of a preassembled or pre-populated circuit board of the camera module proposed according to the present invention is presented in FIG. 1.

A circuit board 12 of a camera module 10 is enclosed by a housing (not depicted in FIG. 1). Located on circuit board 12 is an image sensor chip 14 that is installed directly on circuit board 12 in the course of the chip-on-board (COB) method. Also received on circuit board 12 are other electronic components (not depicted in further detail in FIG. 1) of camera module 10. The alignment of image sensor chip 14 is preferably performed by video assistance with respect to reference openings 24 positioned on circuit board 12 at a 120° pitch 26 with respect to one another. Electrical connection of circuit board 12 is preferably carried out via a connector part 18 into which flexible connecting elements, e.g., flat flexible cables or the like, or a suitable plug system, are inserted, so that tolerances in the mechanical construction of camera module 10 can be compensated for in stress-free fashion. Using a suitable circuit board production process, the electronic components, which are for example SMD components, and image sensor chip 14 can be soldered via contacts 16, for example, to circuit board 12. Reference openings 24 depicted in FIG. 1, provided here at a pitch equal to 120°, are disposed inside a placement area 22 in the vicinity of which a first fitting part 28, e.g., sleeve-shaped, is connected to circuit board 12 in materially attached fashion, e.g., by adhesive bonding. First fitting part 28 has for this purpose, on its underside (not depicted in FIG. 1), a number of fitting pins or fitting pegs corresponding to the number of reference openings 24. In the depiction according to FIG. 1, the axis of symmetry of circuit board 12 is labeled with reference character 20.

First fitting part 28, sleeve-shaped as depicted in FIG. 1, encompasses an inner surface 30 as well as an outer surface 32. It is apparent from the depiction of FIG. 1 that first fitting part 28 installed inside placement area 22 surrounds image sensor chip 14.

Figure 2:
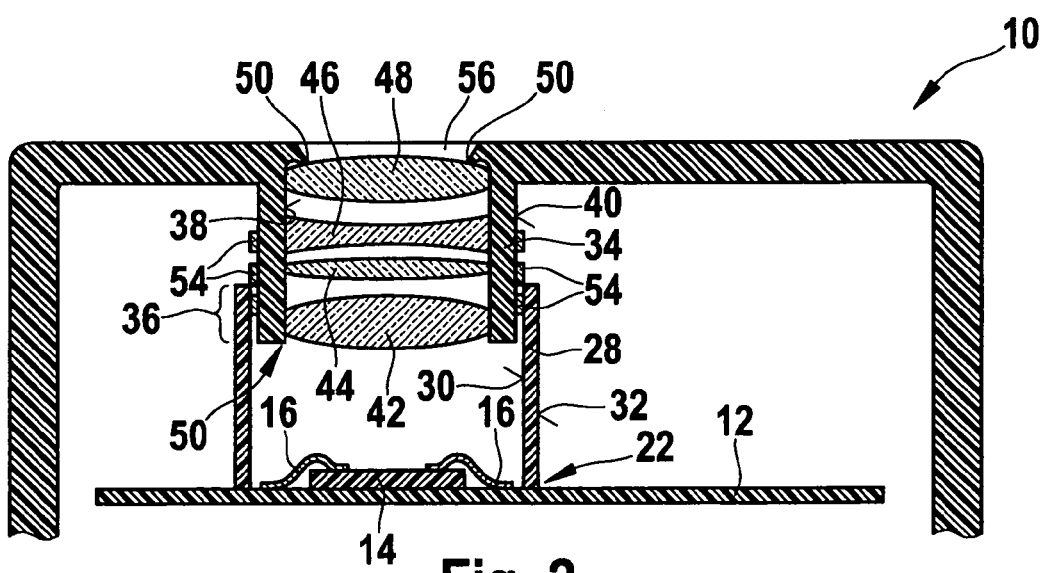
FIG. 2 is a section view through the circuit board taken along section line II-II in FIG. 1, with a section through the housing shell (not depicted in FIG. 1) of the camera module.

FIG. 2 is a section, along section line II-II, through the circuit board as depicted in FIG. 1.

Circuit board 12, on which image sensor chip 14 is connected preferably by way of the chip-on-board (COB) method via contacts 16, is surrounded by a housing shell of camera module 10. Whereas on the upper side of circuit board 12, first fitting part 28 (here sleeve-shaped) is pegged and joined in materially attached fashion to circuit board 12 in the region of placement area 22, a further, second fitting part 34 is located on the inner side, facing toward circuit board 12, of the housing shell of camera module 10. The first, circuit-board-side fitting part 28 and the second, housing-side fitting part 34 are embodied in complementary fashion to one another, so that when circuit board 12 is joined to the housing of camera module 10, an overlap region 36 is created, i.e., a region within which first fitting part 34 projects into first fitting part 28. Second fitting part 34, embodied in complementary fashion to first fitting part 28, forms a tube 52 in which a lens 42 can be received. In lens 42, a first lens element 44 as well as a concave lens element 46 and a convex lens element 48 can be located in second fitting part 34, depending on the purpose of camera module 10. In addition to a cylindrical configuration of the first and second fitting parts 28 and 34, respectively, these can also be embodied rectangularly, cuboidally, or in another geometry; the geometries of the first and second fitting parts 28 and 34, respectively, are matched to one another so that upon joining, the overlap region 36 depicted in FIG. 2 is produced. Whereas first fitting part 28 can be connected in materially attached fashion to circuit board 12 or is pegged to circuit board 12, second fitting part 34 can be an integral constituent of the housing of camera module 10, for example injection-molded onto it. First fitting part 28 forms a mechanical connecting element between circuit board 12 and the housing of camera module 10, and protects image sensor chip 14 from particles. Correct positioning is achieved by way of the guide studs insertable into reference openings 24 in circuit board 12.

Lens 42 is preinstalled in suitable fashion in the housing of camera module 10. This offers the capability of manufacturing camera modules 10 having different optical designs based on the same electronics, since on the basis of the identical-part principle, identically populated circuit boards 12 can be used for different housings having different lenses. Whether embodied integrally with the housing or joined to the housing of camera module 10, second fitting part 34 is designed in such a way that it permits initial focusing between lens 42 and image sensor chip 14.

At least one of the fitting parts 28 or 34 depicted in FIG. 2 is produced from a plastic that, by local heating, can be rapidly melted or fused in a limited region and can thus be welded or adhesively bonded to a mating part. For this purpose, at least one of the two sleeve-shaped fitting parts 28, 34 depicted in FIG. 2, which engage into one another within overlap region 36, is coated, for example, with at least one electrically conducting conductive path 54. A current pulse can be conveyed through the at least one conductive path 54 (here applied on outer surface 40 of second fitting part 34), leading to local melting. Conductive paths 54 that are used for fusion or melting of the plastic material can be led out either to the housing of camera module 10 or to circuit board 12 so that they can be electrically contacted during the process of focusing, i.e., aligning image sensor chip 14 relative to lens 42. Image sensor chip 14 and lens 20 are focused with respect to one another by active image readout and image evaluation, and motorized alignment of the components to be joined to one another, i.e., the housing of camera module 10 and the preassembled circuit board 12. Focusing is accomplished, in a context of active operation of image sensor chip 14, with evaluation of the image of a corresponding test chart. Once set, the focus position of at least one of the two fitting parts 28, 34 is secured preferably by a possible process step, for example local melting of the plastic material. Once established, the focus position is insensitive both to temperature changes and to aging processes.

After focusing is complete, the at least one conductive path 54 on outer surface 40 of second fitting part 34 has applied to it a current pulse that, by way of the melting of the plastic, generates a connection by material attachment, for example an adhesive bond, between first fitting part 28 and second fitting part 34 within overlap region 36 between inner surface 30 of first fitting part 28 and outer surface 40 of second fitting part 34.

The mutually facing surfaces of first fitting part 28 and second fitting part 34 can be textured in such a way that a stable connection can be achieved with a current pulse of minimum application time and power level. In the context of focusing, overlap region 36 of first fitting part 28 and second fitting part 34 ensures that tilting, and nonuniform sharpness distribution resulting therefrom, are minimized. When first fitting part 28 and second fitting part 34 are embodied as cylindrical sleeves, a compensation of azimuth angle can be accomplished; this is possible only to a limited extent when first fitting part 28 and second fitting part 34 are designed in rectangular or cuboidal fashion (cf. FIG. 4).

Focusing can be performed by way of a motorized device, automated if at all possible, on which the two subassemblies, i.e., the housing of camera module 10 and the preinstalled or pre-populated circuit board 12, are aligned by sliding the two fitting parts 28, 34 over one another in such a way that the contrast values of the imaged test chart ascertained in the image data are optimized. Once focusing between image sensor chip 14 and lens 42 has been set, the two fitting parts 28, 34 are immobilized with respect to one another. In addition to the aforementioned application of a current pulse to the at least one conductive path 54 on one of the two fitting parts 28, 34 to be joined to one another, process steps such as edging over, adhesive bonding or methods accelerated by UV curing, welding, clamping, or even laser welding can also be used.

In the proposed method having sleeve-shaped fitting parts 28, 34, the materially attached join located inside overlap region 36 is typically covered by circuit board 12 and the housing of camera module 10, and is therefore poorly accessible. In a variant embodiment of fitting parts 28, 34, outer surface 32 of the first, cylindrical, inner fitting part 28 can be slightly barrel-shaped (convex). This creates for the focusing processing, in addition to compensation for a possible azimuth error, a degree of freedom for compensating for tilting errors that may be present. If the surface of image sensor chip 14 is not located in the plane of sharp imaging but instead is tilted with respect thereto, optimum image sharpness cannot be established simultaneously over the entire image field. In the case of lenses 42 having large apertures, such as those used e.g., for night vision, a perceptible reduction in image quality can be observed as a result of even slight tilting errors.

Focusing a system having this additional degree of freedom for compensating for possible tilting errors requires special equipment technology, since focusing must be performed in consideration of the roll angle as well as the pitch and yaw angles that are present.

Figure 3:
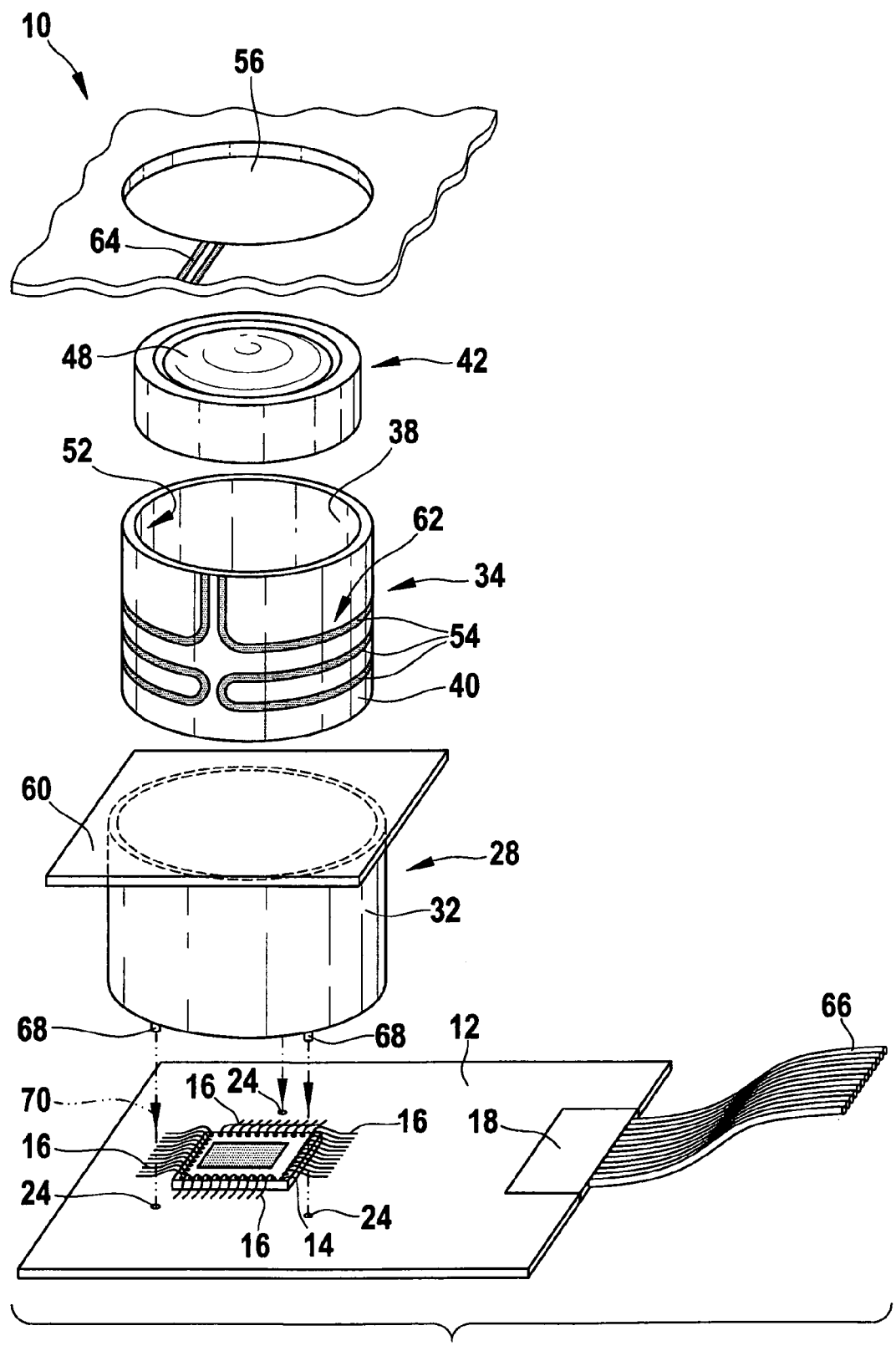
FIG. 3 is an exploded view of the components of a camera module having cylindrical fitting parts embodied in complementary fashion to one another.

FIG. 3 is an exploded view of a camera module proposed according to the present invention, in which the fitting parts embodied in complementary fashion to one another are sleeve-shaped.

It is apparent from the exploded view shown in FIG. 3 that image sensor chip 14 is electrically connected via contacts 16 to circuit board 12 (here depicted schematically). Reference openings 24 are introduced into circuit board 12 with an offset of 120° from one another (see FIG. 1). First fitting part 28 has, on its lower annular surface, a number of fitting pins 68 corresponding to the number of reference openings 24, which pins are inserted into reference openings 24 in joining direction 70 depicted in FIG. 3. After a materially attached connection has been constituted between the lower edge surface of first fitting part 28 and the upper side of the preassembled or pre-populated circuit board 12, image sensor chip 14 received on the upper side of circuit board 12 is surrounded by first fitting part 28. After the installation of first fitting part 28 on circuit board 12, the upper end of the first, sleeve-shaped, fitting part 28 is closed off by a membrane 60. Image sensor chip 14 received on the upper side of circuit board 12 is thereby protected from particles. All the further process, testing, and transport steps, up to the installation of circuit board 12 equipped with first fitting part 28 in the housing of camera module 10, can take place in any production environment. If, for example, membrane 60 is adhesively bonded onto the upper side of first fitting part 28, this prevents omission of the removal of membrane 60 prior to focusing between lens 42 of camera module 10 and image sensor chip 14.

It is further apparent from what is depicted in FIG. 3 that connector part 18 is realized via a flexible end 66. If the electrical connection of circuit board 12 to a housing-side plug is carried out using a flexible solution, as depicted in FIG. 3, stress loads in circuit board 12 due to multiple clamping can be avoided.

The placement direction in which first fitting part 28 is installed, using pins 68 configured on the underside, into reference openings 24 of circuit board 12 is labeled with the reference character 70.

Before the joining of second fitting part 34 to first fitting part 28, firstly membrane 60 closing off first fitting part 28 on the upper side is removed and, upon assembly of the housing of camera module 10, second fitting part 34 mounted thereon is slid into the opening, exposed by membrane 60, of first fitting part 28. The at least one conductive path 54 extending on outer surface 40 of second fitting part 34 thus abut inner surface 30 of first fitting part 28. In addition, lens 42 indicated schematically in FIG. 3 is received in second fitting part 34, opening 56 being embodied above said lens in the housing of camera module 10. The at least one conductive path 54 preferably extends on the outer side of second fitting part 34 in a meander shape 62, in order to achieve the greatest possible contact area between first fitting part 28 and second fitting part 34. It is furthermore evident from FIG. 3 that contacts 64 extend on the upper side of the housing of camera module 10, with which contacts the at least one conductive path 54, applied in coated form on outer surface 40 of second fitting part 34, can be electrically contacted.

Inner surface 38 of second fitting part 34, which surface functions as tube 52, receives lens 42 (indicated here merely schematically). Lens 42 depicted in FIG. 3, which in addition to lens 42 can have further lens elements 44, 46, and 48 indicated in FIG. 2, is preinstalled in the housing of camera module 10. This offers the possibility of manufacturing camera modules 10 with different optical designs, which modules each have identically constructed preassembled and prepopulated circuit boards 12.

Figure 4:
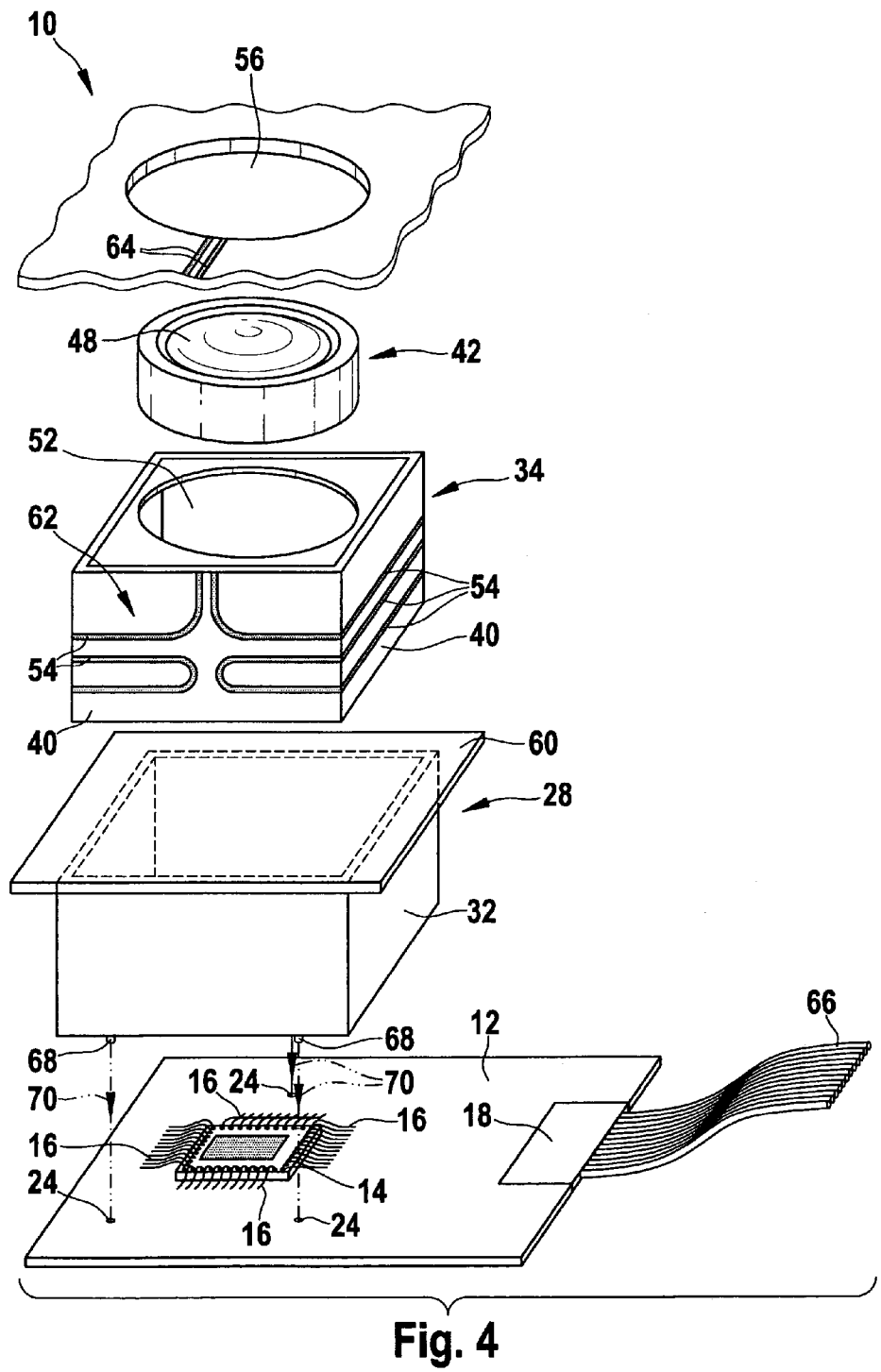
FIG. 4 is an exploded view of an example embodiment of the camera module according to the present invention, having rectangularly configured fitting parts embodied in complementary fashion to one another.

The depiction according to FIG. 4 presents a further variant embodiment of the camera module proposed according to the present invention for motor vehicle applications.

In contrast to the exploded view depicted in FIG. 3 of camera module 10 proposed according to the present invention, according to this variant embodiment both first fitting part 28 and second fitting part 34 have a square geometry. Instead of the square geometry depicted in the Figure, a rectangular geometry or another geometry could also be selected; what must be ensured in each case is that first fitting part 28 and second fitting part 34 form, in the joined state, the overlap region 36 depicted in FIG. 2, at which region a fusion or melting of the plastic material, brought about by the at least one conductive path 54, can be carried out in order to constitute a materially attached connection between first fitting part 28 and second fitting part 34.

According to the variant embodiment in FIG. 4, the upper end of second fitting part 34 is equipped with a closure plate that is flush with opening 56 in the housing of camera module 10. Lens 42, along with other lens elements, can be secured in second fitting part 34 at said opening or on internal parts (not depicted in further detail in FIG. 4) inside second fitting part 34. Although depicted also in FIGS. 3 and 4 as a separate component, second fitting part 34 can be embodied integrally as a single piece on the housing of camera module 10, for example on its roof surface, in the course of the plastic injection molding process.

As depicted in FIG. 4, the at least one conductive path 54, which is electrically contacted via contacts 64 on the housing of camera module 10, extends once again in a meander shape 62 over the rectangular sides, i.e. outer surfaces 40, of second fitting part 34. It would likewise be possible for the at least one conductive path 54 that, in FIG. 4, extends on outer surface 40 of second fitting part 34 to be disposed on inner surface 30 of first fitting part 28. It is once again the case for the variant embodiment of first and second fitting parts 28, 34 depicted in FIG. 4 that the surface portions abutting against one another inside overlap region 36 can be embodied in textured fashion so that a stable connection can be achieved with a current pulse having a minimum application time and power level.

On the side facing toward circuit board 12, first fitting part 28 has fitting pins 68, already mentioned in connection with FIG. 3, that are inserted into reference openings 24 of circuit board 12. In the depiction of FIG. 4 as well, first fitting part 28, in the state mounted on circuit board 12, surrounds the image sensor chip 14 contacted on the circuit board. According to the variant embodiment depicted in FIG. 4 as well, the open end of first fitting part 28 is covered with a film or a membrane 60 for protection of the highly sensitive image array of image sensor chip 14, in order to prevent particles from reaching the surface of image sensor chip 14. Membrane 60, or another suitable covering material, is removed from the upper side of first fitting part 28 only once the first (circuit-board-side) fitting part 28 has been joined to the second (housing-side) fitting part 34, and the materially attached connection between first fitting part 28 and second fitting part 34 is carried out, after focusing between lens 42 and image sensor chip 14, by fusion of the plastic. "Fusion" of the plastic material is understood, in connection with first fitting part 28 and second fitting part 34 (whether they are sleeve-shaped or, as in FIG. 4, rectangular or square-shaped), to mean that both inner surface 30 of first fitting part 28 and outer sides 40 of second fitting part 34 can be fused or melted.

In the context of the assembly variants depicted in FIGS. 3 and 4 having fitting parts 28, 34 embodied with different geometries, focusing is accomplished using motorized automated devices with which the two subassemblies—circuit board 12 equipped with first fitting part 28, and the housing of camera module 10 equipped with second fitting part 34—are slid into one another. Focusing of the two components, i.e., of the housing of camera module 10 and of the preassembled circuit board 12, is accomplished in such a way that the contrast values of imaged test charts, which values are ascertained from image data during focusing, are optimized. Focusing is performed, in a context of active operation of image sensor chip 14, by evaluating the image of a corresponding test chart. The focus position is produced by the delivery of a current pulse onto the at least one conductive path 54 on one of the two fitting parts 28, 34; this enables the fastest possible process step for immobilizing the optimum focus position of lens 42 with respect to image sensor chip 14.

Camera module 10 described above in connection with FIGS. 1 to 4 enables the use of an image sensor chip 14 that, by way of a video-assisted die bonding process, can be positioned directly and with high precision with respect to reference openings 24 in circuit board 12. Placement errors that occur with image sensors received in separate housings are precluded by the approach proposed according to the present invention. In addition, the circuit-board-side fitting part, i.e. in the present case first fitting part 28, can be aligned in accurately fitting fashion with reference openings 24 and adhesively bonded there, after pegging, by way of a materially attached connection.

If circuit board 12 is attached to the housing-side plug using a flexible solution such as, for example, flexible cable end 66, stress loads in circuit board 12 due to multiple clamping can be avoided. First fitting part 28 as well as second fitting part 34 are preferably fabricated from a material that is suitable for the optical requirements, so that, for example, sufficiently low reflection values occur and the risk of optical interference due to scattered light remains limited. Lens 42 is installed sealedly into the housing of camera module 10, so that a subsequent sealing process step is no longer necessary. The assembly method proposed according to the present invention furthermore permits an accurately adjusted focus position between lens 42 and image sensor chip 14 to be secured. The focus position, once accurately determined, can be quickly implemented by way of the electrically controllable local melting or fusing process, to constitute a materially attached connection between first fitting part 28 and second fitting part 34. In contrast to laser welding or UV curing, no problems occur with regard to delivering to the at least one conductive path 54 the energy necessary for activation of the materially attached connection. With regard to series production, it is advantageous that one and the same preassembled and populated circuit board 12 can be used for camera modules 10 having different optical designs but the same electronic configuration, and that only the housing of camera modules 10 needs to be embodied in application-specific fashion, adapted for the particular lens 42 that needs to be accommodated for the particular application.

What is claimed is:

1. A method for manufacturing a camera module including a housing, a lens and an image sensor chip, the image sensor chip being connected to a circuit board, the method comprising:
    a) positioning and securing on the circuit board a first fitting part that surrounds the image sensor chip;
    b) positioning the first fitting part to abut a second fitting part disposed on the housing of the camera module, wherein an overlap region is formed between the first and second fitting parts;
    c) establishing a focus position between the lens and the image sensor chip; and
    d) forming a fixed connection between the first and second fitting parts at the overlap region, in the focus position established according to c);
    wherein after a) is carried out, a cover is applied onto the first fitting part surrounding the image sensor chip, and wherein the cover is removed before b) is carried out.

2. The method as recited in claim 1, wherein according to method step a), the first fitting part is pegged to the circuit board at a placement region.

3. The method as recited in claim 1, wherein according to method step a), a fixed connection is produced between the first fitting part and the circuit board.

4. The method as recited in claim 1, wherein according to method step c), the focus position of the lens and image sensor chip is ascertained along the optical axis, the image sensor chip is electrically connected for an image evaluation, and the housing of the camera module and the circuit board are aligned with one another by motorized actuation.

5. The method as recited in claim 1, wherein according to method step d), the fixed connection is formed by melting of the material of the first and second fitting parts, wherein the melting is accomplished via at least one conductive path on at least one of the first and second fitting parts.

6. The method as recited in claim 1, wherein according to method step a), the first fitting part is pegged to the circuit board at a placement region, and wherein according to method step c), the focus position of the lens and image sensor chip is ascertained along the optical axis, the image sensor chip is electrically connected for an image evaluation, and the housing of the camera module and the circuit board are aligned with one another by motorized actuation.

7. The method as recited in claim 6, wherein according to method step d), the fixed connection is formed by melting of the material of the first and second fitting parts, wherein the melting is accomplished via at least one conductive path on at least one of the first and second fitting parts.

8. The method as recited in claim 1, wherein according to method step a), a fixed connection is produced between the first fitting part and the circuit board, and wherein according to method step c), the focus position of the lens and image sensor chip is ascertained along the optical axis, the image sensor chip is electrically connected for an image evaluation, and the housing of the camera module and the circuit board are aligned with one another by motorized actuation.

9. The method as recited in claim 8, wherein according to method step d), the fixed connection is formed by melting of the material of the first and second fitting parts, wherein the melting is accomplished via at least one conductive path on at least one of the first and second fitting parts.

10. The method as recited in claim 1, wherein the first and second fitting parts having a mutually complementary geometry including one of a sleeve-shaped form, a rectangular form, or a square form.

11. The method as recited in claim 1, wherein at least one electrically contactable conductive path extends on at least one of the first and second fitting parts.

12. The method as recited in claim 11, wherein the at least one conductive path is formed on one of: a) the outer surface of the second fitting part that projects into the first fitting part; or b) the inner surface of the first fitting part that surrounds the second fitting part.

* * * * *

UNITED STATES PATENT AND TRADEMARK OFFICE
CERTIFICATE OF CORRECTION

PATENT NO.        : 8,711,277 B2
APPLICATION NO.   : 12/224454
DATED             : April 29, 2014
INVENTOR(S)       : Uwe Apel It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1115 days.

Signed and Sealed this
Twenty-ninth Day of September, 2015

Michelle K. Lee
*Director of the United States Patent and Trademark Office*